(12) United States Patent
Fellner et al.

(10) Patent No.: US 8,189,409 B2
(45) Date of Patent: May 29, 2012

(54) READOUT CIRCUIT FOR REWRITABLE MEMORIES AND READOUT METHOD FOR SAME

(75) Inventors: Johannes Fellner, Pirka (AT); Gregor Schatzberger, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 246 days.

(21) Appl. No.: 12/716,010

(22) Filed: Mar. 2, 2010

(65) Prior Publication Data

US 2010/0220532 A1    Sep. 2, 2010

(30) Foreign Application Priority Data

Mar. 2, 2009   (DE) .......................... 10 2009 011 255

(51) Int. Cl.
   *G11C 7/00*   (2006.01)
(52) U.S. Cl. .......... 365/189.15; 365/185.05; 365/185.25
(58) Field of Classification Search ............. 365/185.18, 365/185.2, 185.21, 185.25, 189.15, 201, 365/185.09, 205
   See application file for complete search history.

(56) References Cited

U.S. PATENT DOCUMENTS

| | | | |
|---|---|---|---|
| 5,528,543 A | 6/1996 | Stiegler | |
| 6,072,727 A | 6/2000 | La Rosa | |
| 6,078,524 A * | 6/2000 | Chen | 365/185.21 |
| 6,128,227 A * | 10/2000 | Kim | 365/185.21 |
| 6,307,797 B1 * | 10/2001 | Fournel et al. | 365/189.09 |
| 6,363,015 B1 * | 3/2002 | Barcella et al. | 365/185.21 |
| 6,483,351 B2 * | 11/2002 | Sim | 327/52 |
| 6,490,203 B1 | 12/2002 | Tang | |
| 2008/0080295 A1 | 4/2008 | Namekawa et al. | |

OTHER PUBLICATIONS

Lipp, R. et al.: "A High Density Flash Memory FPGA Family," Custom Integrated Circuits Conference, Proceedings of the IEEE 1996, pp. 239-242, May 5-8, 1996, doi: 10.1109/CICC.1996.510550.

* cited by examiner

*Primary Examiner* — Gene Auduong
(74) *Attorney, Agent, or Firm* — Cozen O'Connor

(57) ABSTRACT

In one embodiment, a readout circuit for rewritable memories comprises a control logic unit with an input for supplying a start signal and with several outputs for providing a respective control signal as a function of start signal, a first terminal for switchable connection to a first memory cell by means of a first switch, and a second terminal for switchable connection by means of a second switch to a second memory cell, and a readout unit coupled to the control logic unit, as well as to the first and second terminals, with an output for providing an output signal as a function of a state of the first and/or the second memory cell and as a function of the control signals, wherein the readout circuit is designed for self-terminating operation in a reading mode and in a test mode. A readout method for rewritable memories is additionally provided.

26 Claims, 4 Drawing Sheets

READOUT CIRCUIT FOR REWRITABLE MEMORIES AND READOUT METHOD FOR SAME

RELATED APPLICATION

This application claims the priority of German patent application no. 10 2009 011 255.3 filed Mar. 2, 2009, the entire content of which is hereby incorporated by reference.

FIELD OF THE INVENTION

The invention relates to a readout circuit for rewritable memories and a readout method for same.

BACKGROUND OF THE INVENTION

The rewritable memories described in the context of this invention are known as EEPROMs, electrically erasable programmable read-only memories, or so-called flash memories. One characteristic of an EEPROM or flash memory is that the stored data is retained even with the supply voltage turned off. Depending on the technology employed, the physical parameters of the memory elements change due to repeated writing. Depending on the number of memory accesses, a so-called threshold voltage provided by the respective memory element changes. Connected with this is change in the current yield of the respective memory cell. A very high number of write accesses can lead to a total failure of individual memory elements due to oxide breakdown.

Another characteristic of EEPROMs or flash memories is the dependence of the drain-source current of a memory cell on its supply voltage. At a low supply voltage, the drain-source current sharply decreases and, for example, hinders or slows the reading of a memory cell.

Readout circuits, known as sense-amplifiers, evaluate the logic state of a memory cell. In the design of EEPROMs or flash memory, readout circuits are a particular challenge. On the one hand, the readout circuits must be very fast and space-efficient but on the other, they should reflect the changes of the memory cells due to multiple writing and read out the correct value even at low supply voltages. In addition, the readout circuits and the structure of a rewritable memory must be adapted to the specific requirements of an application.

A known readout circuit for EEPROMs or flash memories is based on a fully differential sense-amplifier for low supply voltages. In this case the current of a bit cell is compared in a comparator to the current of a reference cell and stored in a downstream latch. The on-time of the circuit must be set in such a manner that the sense-amplifier has made its decision with respect to the value stored in the bit cell before the readout circuit is turned off again. The reserve for the on-time must be sufficiently large to account for process variations of high-voltage and low-voltage transistors. The time span from the decision of the measuring amplifier to the switching-off of the readout circuit entails an increased power consumption.

In another known readout circuit, an optimal reading reserve is realized by realizing one data bit using two memory cells. The two memory cells here are programmed oppositely to one another. This achieves a doubled reading certainty. On the other hand, the number of memory cells doubles.

SUMMARY OF THE INVENTION

One object of the present invention is to provide a readout circuit and a readout method for rewritable memories which allow an improved reading with respect to, for example, reading time, supply voltage and power consumption.

In a first embodiment, a readout circuit for rewritable memories comprises a control logic unit, a first terminal for switchable connection to a first memory cell by means of a first switch, a second terminal for switchable connection by means of a second switch to a second memory cell, as well as a readout unit coupled to the first and the second terminals. The control logic unit has an input for supplying a start signal and several outputs for providing a respective control signal as a function of the start signal. The readout unit has an output for providing an output signal as a function of a state of the first and/or second memory cell and as a function of the control signals. The readout circuit is designed for self-terminated operation in a reading mode and in a test mode.

The start signal initiates a reading process, the temporal sequence of which is controlled by the control logic unit. In the reading mode, the state of the first memory cell and the state of the second memory cell are evaluated in the readout unit. In the test mode, the state of the first memory cell or the state of the second memory cell is evaluated in the readout unit. The result of this evaluation is provided at the output in the form of the output signal controlled by the control signals of the control logic unit.

The readout circuit advantageously recognizes on its own, based on the self-termination, when the respective evaluation result is available at the output and then ends the reading process automatically or on its own. The reading speed is thereby increased and at the same time the power consumption is minimized.

The state of a memory cell is either programmed or unprogrammed. The programmed state is represented, for example, by a logic 1 and the unprogrammed state by a logic 0.

The self-terminated operation, also called self-timed operation in each operating mode comprises a respective automatic recognition of the availability of an evaluation result, and the automatic termination of the reading process by the readout circuit.

The readout circuit is suitable for rewritable memories with reference cells or for rewritable memories in which one data bit is formed by two memory cells. In the first case, the first memory cell consequently contains the data bit to be read and the second memory cell contains a reference bit. In the second case, the first memory cell again contains the data bit to be read and the second memory cell comprises a second bit having the inverted memory state relative to the first memory cell. The first and second memory cells each comprise, for instance, a high-voltage transistor, which is preferably implemented in MOS technology. When a reference cell is used, a transistor is employed in which a so-called floating gate terminal is short-circuited to a so-called control gate terminal. A current generated by the reference cell is configured at a level that lies in the middle between a current provided by a programmed memory cell and the current provided by an erased memory cell. This is achieved by setting a gate-source voltage with the aid of a voltage at the gate terminal.

In an additional embodiment, the first and the second switches are each controlled by a first control signal provided by the control logic unit.

The first control signal is provided as a function of the start signal.

In one refinement, the readout unit comprises a discharge unit for discharging a first and a second line, and a readout amplifier, at the output of which the output signal is provided. The first line is connected on the one hand to the first terminal of the readout circuit and on the other to a first output of the discharge unit. The second line is connected on the one hand to the second terminal of the readout circuit and on the other to a second output of the discharge unit. A first input of the reading amplifier is switchably connected via a first reading switch to the first output of the discharge unit. A second input of the readout amplifier is switchably connected via a second reading switch to the second output of the discharge unit.

At the beginning of each reading process, in both the reading and the test mode, the first and the second line as well as the output are discharged. The output signal is thereby reset.

Voltage peaks at the output of the readout circuit are advantageously avoided by the discharging. It is also assured that the result of the previous reading process is erased.

In an additional embodiment, the first and the second reading switches are each controlled by a second control signal provided by the control logic unit.

In one refinement, the discharge unit has a third, fourth and fifth switch. The third switch is designed for switchably connecting the first terminal to a reference potential terminal. The fourth switch is designed for switchably connecting the first terminal to the second terminal, and the fifth switch is designed for switchably connecting the second terminal to the reference potential terminal.

By closing the third, fourth and fifth switches, both the first line and the second line are short-circuited to the reference potential terminal. The first and second lines are thereby discharged.

In one refinement, the third switch is controlled by a third control signal, the fourth switch by a fourth control signal and the fifth switch by a fifth control signal. The third, fourth and fifth control signals are each provided by the control logic unit.

The separate controlling of the third, fourth and fifth switches allows separate discharging of the first or the second line in the test mode, and simultaneous common discharging of the first and second lines in the reading mode.

In another embodiment, the readout amplifier has a comparison memory unit and an output unit. At its first terminal, the comparison memory unit is switchably connected via the first reading switch to the first output of the discharge unit. At its second terminal, the second input of the readout amplifier is switchably connected via the second reading switch to the second output of the discharge unit. A first comparison signal, which is supplied to the control logic unit, is provided at a first output of the comparison memory unit. A second comparison signal, which is supplied to the control logic unit, is provided at a second output of the comparison memory unit. An eighth control signal, which is provided by the control logic unit, is supplied to the output unit at a first input. A second input of the output unit is switchably connected by means of a sixth switch to the second output of the comparison memory unit. A third input of the output unit is switchably connected by means of a seventh switch to the first output of the comparison memory unit. The output signal is provided at the output of the output unit.

A current flowing through the first line is compared in the comparison memory unit to a current flowing through the second line. In the reading mode, the current on the first line corresponds to a current supplied by the first memory cell, and the current on the second line corresponds to a current supplied by the second memory cell. In the test mode, a reference current, on which the comparison is based, is supplied to either the first line or the second line. In both operating modes, the comparison result is provided as a first and second comparison signal at the output of the comparison memory unit, and is supplied to the control logic unit. If the control logic unit recognizes a change of state of the first or second comparison signal, then the sixth and seventh switches are closed. The second comparison signal is thus supplied to the second input of the output unit, and the first comparison signal is supplied to the third input of the output unit. Consequently, the output signal changes as a function of the eighth control signal and the comparison result determined by the comparison memory unit.

The readout amplifier advantageously automatically ends a reading process in the test mode and in the reading mode whenever it recognizes a change of state based on the first and second comparison signals fed back to the control logic unit, and has therefore made its decision. Power consumption is thereby further reduced.

In one refinement, the sixth and the seventh switches are each controlled by a sixth control signal provided by the control logic unit.

The sixth control signal is provided by the control logic unit as a function of the first or second comparison signal.

In another embodiment, the comparison memory unit comprises a first inverter and a second inverter. One input of the first inverter is connected to the first terminal of the comparison memory unit. One output of the first inverter is connected to the first output of the comparison memory unit. One input of the second inverter is coupled to the second terminal of the comparison memory unit. One output of the second inverter is coupled to the second output of the comparison memory unit.

A current on the first line is supplied via the first reading switch to the first inverter. A current on the second line is supplied via the second reading switch to the second inverter. If a potential on the first line or on the second line reaches the breakover point of the first or second inverter, then the output of the respective inverter changes over. The first inverter provides the first comparison signal, and the second inverter provides the second comparison signal. If the state of one of the two comparison signals changes, the inverters are switched from the comparison configuration into a storage configuration. The storage configuration can also be referred to as a latch configuration. The determined state of the first and/or second memory cell remains stored in the comparison memory unit.

In one refinement, the output unit comprises a first NAND-gate, a second NAND-gate and a third inverter. A first input of the first NAND-gate is formed by the first input of the output unit. A second input of the first NAND-gate is formed by the second input of the output unit. A first input of the second NAND-gate is formed by the first input of the output unit, and a second input of the second NAND-gate is formed by the third input of the output unit. At one output of the second NAND-gate, a signal inverted with respect to the output signal is provided. One input of the third inverter is connected to the output of the first NAND-gate. The output signal is provided at the output of the third inverter.

As soon as the control logic unit has recognized a change of state of the first or second comparison signal, the first comparison signal is supplied to the second NAND-gate and the second comparison signal is supplied to the first NAND-gate. The eighth control signal supplied to the respective other inputs of the first and second NAND-gates is switched to logic 1, so that a respective change of the first or second comparison signal appears at the output of a second or first NAND-gate and is provided in the form of the output signal.

In another embodiment, the readout circuit has a charge accelerator for additional charging of the readout unit. The charge accelerator is coupled to the first and second terminal of the readout circuit as well as to the control logic unit.

The charge accelerator produces an additional current flow that is added to the respective current flow on the first and second line at the first and second terminal of the readout circuit.

Even at low supply voltages, the readout circuit is advantageously still capable of securely reading out the state of the first and/or second memory cell, despite the low currents, lying in the microampere range, supplied by the first and/or second memory cell. The time that a readout process requires is advantageously reduced in this way, for example by a factor of 10.

In one refinement, the charge accelerator comprises a first and a second integrator. The first integrator has a control input that is coupled to the second terminal of the readout circuit. The second integrator has a control input that is coupled to the first terminal of the readout circuit.

The first integrator brings about an increased current flow on the first line if the first memory cell is programmed. The potential on the first line thereby increases more quickly than the potential on the second line. Thus the first inverter, which is connected to the first line, reaches its switching threshold earlier.

In one refinement, the first integrator has a first capacitor and a first controlled current source. The first capacitor is connected on the one hand to the reference potential terminal of the readout circuit and on the other to the first terminal of the readout circuit. The first controlled current source comprises the first control input of the first integrator. The first controlled current source is connected on the one hand via an eighth switch to a supply potential terminal and on the other to the first terminal of the readout circuit. The second integrator has a second capacitor and a second controlled current source. The second capacitor is connected on the one hand to the reference potential terminal of the readout circuit and on the other to the second terminal of the readout circuit. The second controlled current source comprises a control input of the second integrator and is switchably connected on the one hand via a ninth switch to the supply potential terminal, and on the other to the second terminal of the readout circuit In an additional embodiment, the eighth and the ninth switches are each controlled by a seventh control signal provided by the control logic unit.

During a readout process, the eighth and ninth switches are controlled into the closed state with the aid of the seventh control signal from the control logic unit. If the first memory cell is in the erased or unprogrammed state, then there is no additional current flow over the first line into the first capacitor. An additional current flow results on the second line, whereby the potential rises more rapidly on the second line than on the first line. Since the control input of the first controlled current source is connected to the second line, the first controlled current source is regulated back in case of increasing potential on the second line, and therefore supplies less current for charging the first capacitor. The increase of the potential on the first line is further retarded. The control input of the second controlled current source is connected to the first line and thus supplies a current for charging the second capacitor. Thus the switching threshold of the second inverter is reached more quickly and the control logic unit terminates the readout process by opening the eighth and ninth switches by means of the seventh control signal.

A mismatch of the switching thresholds of the first and second inverters can advantageously be compensated by the additional current of the first or second integrator.

In one refinement, the charge accelerator has a first and a second transistor. The first transistor comprises a control terminal that is connected to the second terminal of the readout circuit, as well as a controlled path that is connected at one end to the first terminal of the readout circuit and at the other to the reference potential terminal. The second transistor comprises a control terminal that is connected to the first terminal of the readout circuit, as well as a controlled path that is connected at one end to the second terminal of the readout circuit and at the other to the reference potential terminal.

For the above-described case, the rise of the potential on the second line is still further accelerated by the cross-coupled transistors. Thus the switching threshold of the second inverter is reached even sooner. The second current source is further boosted. The input of the first inverter is drawn to reference potential with the aid of the first transistor.

Advantageously, this results in a further increase of the readout speed as well as a better interference protection. The signal-to-noise ratio is increased by the cross-coupled transistors.

In another embodiment, the first, second, third, fourth and fifth switches as well as the first and second reading switches are each controlled into the closed state in a charging phase in the reading mode, and the sixth and seventh switches are each controlled into the open state. In a readout phase, the first and second switches are controlled into the closed state, and the third, fourth and fifth switches are each controlled into the open state. In a storage phase, the sixth and seventh switches are each controlled into the closed state, and the first, second, third, fourth and fifth switches, as well as the first and second reading switches, are each controlled into the open state.

In the charging phase, the first and second lines are discharged to reference potential via the closed first through fifth switches as well as the closed reading switches. In the readout phase, the third, fourth and fifth switches are opened, so that the respective state of the first and second memory cell is supplied to the readout amplifier with the first and second switches closed, as well as with a closed first and second reading switch. A change of state at the outputs of the comparison memory unit marks the beginning of the storage phase. Here, the sixth and the seventh switches are each closed, in order for the comparison result of the readout phase to be stored. Since the readout is finished in the storage phase, the first through fifth switches as well as the first and second reading switches are opened.

In one refinement, the eighth and ninth switches are each controlled into the closed state in the discharge and in the readout phase. In the storage phase, the eighth and ninth switches are each controlled into the open state.

The closing of the eighth and ninth switches in the readout phase produces the faster charging by means of the charge accelerator.

A reduction of the readout time is advantageously achieved in this way. The readout is possible within a reasonable time even at low supply voltages in the 1 Volt range, at which the memory cells supply small currents in the microampere range.

In another embodiment, the output signal is provided in the reading mode as a function of a result of a comparison of a current through the first memory cell to a current through the second memory cell.

In one refinement, the output unit in the test mode comprises a multiplexer for testing the first and/or second memory cell. The multiplexer has a first input, a second input and a control input for the supply of a first test control signal provided by the control logic unit. The first input is connected to the output of the first NAND-gate of the output unit. The second input is connected to the output of the second NAND-gate of the output unit. The multiplexer further comprises an output that is connected to the input of the third inverter of the output unit.

In the test mode, the degree of programming of the first or second memory cell is evaluated. An external reference current is applied to the first terminal of the readout circuit in order to evaluate the first memory cell. This current is subtracted from the current of the first memory cell. The second line is simultaneously set to reference potential via the closed fifth switch. The output of the first NAND-gate of the output unit is connected by the multiplexer to the input of the inverter. If the first memory cell is only weakly programmed, then the output of the readout circuit remains at logic 0, If the first memory cell is only weakly erased, then the output of the readout circuit remains at logic 1.

Thus, weakly erased or weakly programmed memory cells are advantageously recognized. Due to the digital readback of the memory cell contents, the alternative, very time-intensive analog current measurement of each memory cell can be eliminated.

In another embodiment, the first, second, third, fourth and fifth switches, as well as the first and second reading switches, are each controlled into the closed state in the discharge phase of the test mode. The sixth and seventh switches are each controlled into the open state. In the readout phase of the test mode, the first and second switches are each controlled into the closed state, and the fourth switch, as well as the third or fifth switches, are each controlled into the open state. In the storage phase of the test mode, the first or the second, as well as the sixth and seventh switches are each controlled into the closed state, and the third, fourth and fifth switches, as well as the first and second reading switches, are each controlled into the open state.

The discharge phase of the test mode corresponds with respect to the controlling of the switches and the electrical conditions of the circuit to the discharge phase of the reading mode. The first and second lines and the output are discharged to reference potential. In the readout phase of the test mode, either the first line or the second line is active for evaluating the first or the second memory cell. With a closed first switch, the first memory cell is evaluated, and with a closed second switch the second memory cell is evaluated. The respective other line is connected to the reference potential terminal closing the associated switch. In the storage phase of the test mode, the sixth and the seventh switches are closed in order to store the result of the readout phase. The first, second, third, fourth and fifth switches, as well as the first and second reading switches, are open.

In one refinement, the output signal is provided in the test mode as a function of a result of a comparison of a current through the first memory cell or a current through the second memory cell with a reference current.

In another embodiment, for testing the first memory cell, the reference current is supplied to the first terminal of the readout circuit, the fifth switch is controlled into the closed state and the first input of the multiplexer is connected to its output. Alternatively, for testing the second memory cell, the reference current is supplied to the second terminal of the readout circuit, the third switch is controlled into the closed state and the second input of the multiplexer is connected to its output.

In one embodiment, a readout method for rewritable memories has the following steps:
discharging a first line coupled to a first terminal and switchably connectable to a first memory cell, and discharging a second line coupled to a second terminal and switchably connectable to a second memory cell, as well as discharging an output,
reading out a respective state of the first and/or the second memory cell,
storing the respective state of the first and/or the second memory cell,
providing the respective state of the first and/or the second memory cell at the output.

In one refinement, an accelerated charging of the first and second lines after discharging is provided.

The readout time is thereby advantageously reduced.

In an additional embodiment, the respective state of the first and second memory cells is read out and stored in a reading mode. A result of a comparison of a current through the first memory cell with a current through the second memory cell is provided at the output.

In one refinement, the respective state of the first or the second memory cell is selectively adjustable read out and stored in a test mode. Correspondingly, a result of a comparison of a current through the first memory cell or a current through the second memory cell to a reference current is provided at the output.

BRIEF DESCRIPTION OF THE DRAWINGS

Several exemplary embodiments of the invention are described in detail below with reference to the figures. Components and circuit elements that are functionally identical or have the identical effect bear identical reference numbers. Insofar as circuit parts or components correspond to one another in function, a description thereof will not be repeated in each of the subsequent figures.

DETAILED DESCRIPTION OF THE DRAWINGS

Figure 1:
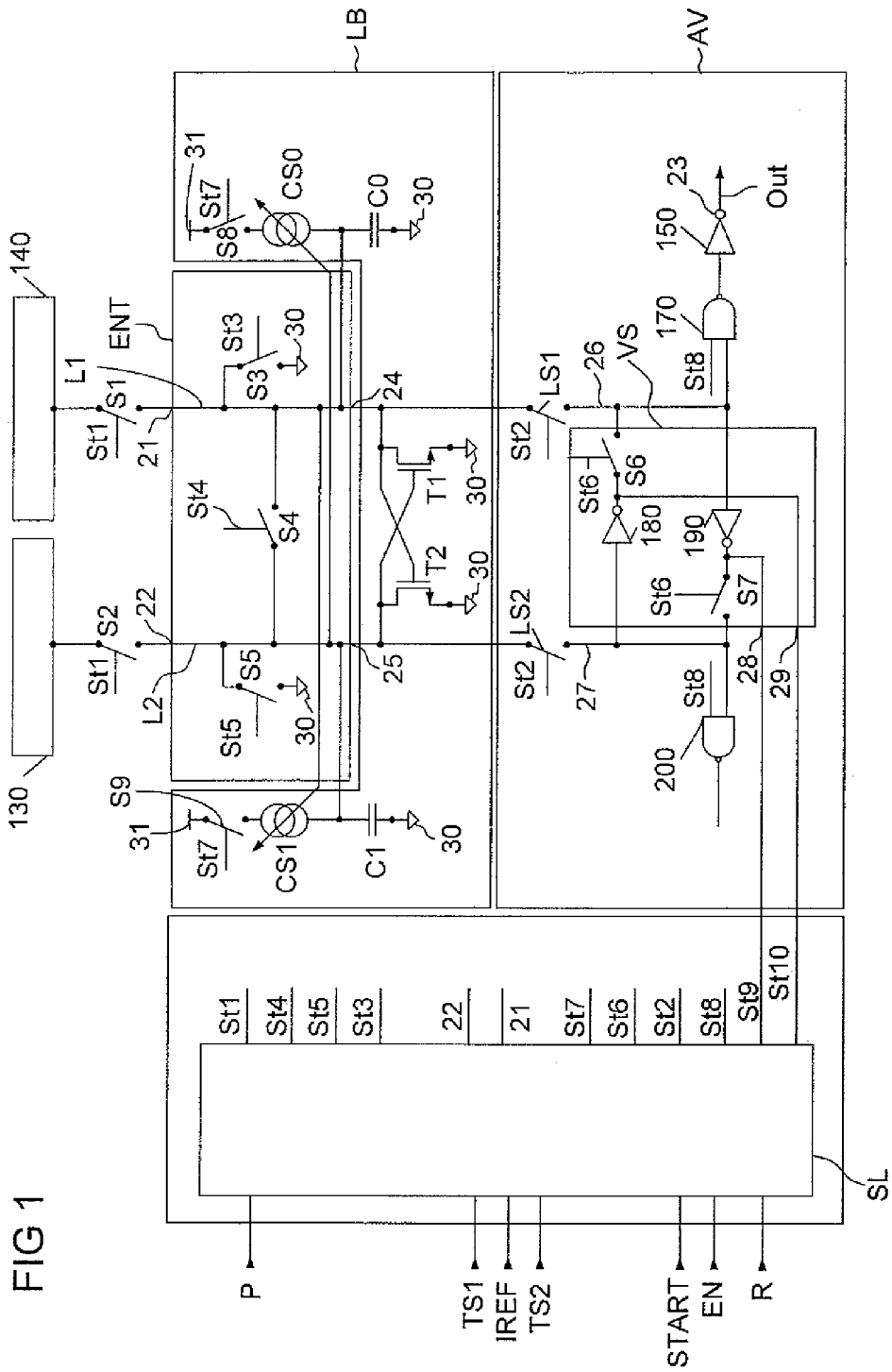
FIG. 1 shows a first exemplary embodiment of a readout circuit according to the invention.

FIG. 1 shows a first exemplary embodiment of a readout circuit according to the invention. The readout circuit comprises a control logic unit SL, a discharge unit ENT, a charge accelerator LB and a readout amplifier AV. In addition, a first memory cell 140 and a second memory cell 130 are shown in FIG. 1. The readout circuit has a first terminal 21, a second terminal 22 and an output 23. First memory cell 140 is connectable via a first switch S1 to first terminal 21. Second memory cell 130 is connectable via a second switch S2 to second terminal 22. Control logic unit SL has an input for supplying a start signal START. Control logic unit SL has additional inputs to be respectively supplied with a reset signal R, an enable signal EN, a programming signal P, a first test signal TS1, a second test signal TS2 and a reference current IREF. Control logic unit SL has outputs for respectively providing a first control signal St1, a second control signal St2, a third control signal St3, a fourth control signal St4, a fifth control signal St5, a sixth control signal St6, a seventh control signal St7 and an eighth control signal St8. An additional terminal of control logic unit SL is coupled to first terminal 21 and one terminal of control logic unit SL is coupled to second terminal 22. A first comparison signal St9 is supplied to an additional input of control logic unit SL and a second comparison signal St10 is supplied to an additional input of control logic unit SL.

Discharge unit ENT has first terminal 21, second terminal 22, a first output 24 and a second output 25. A first line L1 is formed between first terminal 21 and first output 24. A second line L2 is formed between second terminal 22 and second output 25. Discharge unit ENT has a third switch S3, a fourth switch S4 and a fifth switch S5. Third switch S3 is connected on the one hand to first terminal 21 and on the other to a reference potential terminal 30. Fourth switch S4 is connected on the one hand to first terminal 21 and on the other to second terminal 22. Fifth switch S5 is connected on the one hand to second terminal 22 and on the other to reference potential terminal 30. Third switch S3 is controlled by third control signal St3, fourth switch S4 is controlled by fourth control signal St4 and fifth switch S5 is controlled by fifth control signal St5.

Readout amplifier AV comprises a first reading switch LS1, a second reading switch LS2, a comparison memory unit VS, a first NAND-gate 170, a second NAND-gate 200 and a third inverter 150. A first terminal 26 of readout amplifier AV is switchably connected via first reading switch LS1 to first output 24 of discharge unit ENT. A second terminal 27 of reading amplifier AV is switchably connected via second reading switch LS2 to second output 25 of the discharge unit ENT. Readout amplifier AV comprises the output 23 for providing an output signal Out. Comparison memory unit VS has a first inverter 190 and a second inverter 180, as well as a sixth switch S6 and a seventh switch 37. One input of first inverter 190 is connected to first terminal 26. One output of first inverter 190 is switchably connected via seventh switch S7 to one input of second NAND-gate 200. One input of second inverter 180 is connected to second terminal 27. One output of second inverter 180 is switchably connected via sixth switch S6 to one input of first NAND-gate 170. To each other input of first and second NAND-gates 170, 200 the eighth control signal St8 is provided respectively. One output of first NAND-gate 170 is connected to one input of third inverter 150. The output of first inverter 190 forms a first output 28 of comparison memory unit VS, at which the first comparison signal St9 is provided. The output of second inverter 180 forms a second output 29 of comparison memory unit VS, at which the second comparison signal St10 is provided. First reading switch LS1 and second reading switch LS2 are each controlled by second control signal St2. Sixth switch S6 and seventh switch S7 are each controlled by sixth control signal St6. One output of third inverter 150 forms the output 23 of the readout circuit.

Charge accelerator LB has a first integrator CS0, C0, a second integrator CS1, C1, an eighth and a ninth switch S8, S0 as well as a first and a second transistor T1, T2. The first integrator has a first controlled current source CSC and a first capacitor C0. The second integrator has a second controlled current source CS1 and a second capacitor C1. One control input of first controlled current source CS0 is connected to second terminal 22. First controlled current source CS0 is connected on the one hand via eighth switch S8 to a supply potential terminal 31 and on the other to first capacitor C0. First capacitor C0 is referenced to reference potential terminal 30. One control input of second controlled current source CS1 is connected to the first terminal 21. Second controlled current source CS1 is connected on the one hand via ninth switch S9 to supply potential terminal 31 and coupled on the other to second capacitor C1. Second capacitor C1 is referenced to reference potential terminal 30. Eighth and ninth switches S8, S9 are each controlled by seventh control signal St7. First transistor T1 and second transistor T2 are each realized as NMOS transistors. The respective source terminals of first and second transistors T1, T2 are each referenced to reference potential terminal 30. A gate terminal of first transistor T1 is coupled to second terminal 22, and a drain terminal of first transistor T1 is coupled to first terminal 21. A gate terminal of second transistor T2 is coupled to first terminal 21, and a drain terminal of second transistor T2 is coupled to second terminal 22.

In this embodiment, first memory cell 140 comprises the memory cell whose state is to be determined. Second memory cell 130 is implemented either as a reference bit cell or as a second memory cell. In an implementation as a reference bit cell, a current generated by this reference bit cell is set in such a manner that its level lies at the center between a current output from a programmed memory cell and a current output from an unprogrammed memory cell. In an implementation as the second memory cell, the respective memory state that is inverted relative to the first memory cell 140 is programmed.

The readout circuit is designed for selective operation in a reading mode and in a test mode. In the reading mode, the state of first and second memory cells 130, 140 is determined. The readout process, whose temporal sequence is determined by the control logic unit SL, is based on the measuring and evaluation of two currents. One current is generated by first memory cell 140 and a second current is generated by second memory cell 130. The level of the two currents is compared. The result of this comparison is provided as digital output signal Out at output 23. In the test mode, the degree of programming of the memory cells is evaluated. For this purpose, the current supplied by a first memory cell 140 is compared to a reference current IREF supplied to control logic unit SL. The temporal sequence, as well as the functioning of the readout circuit, will be explained with reference to the timing diagrams of FIG. 2.

Figure 2:
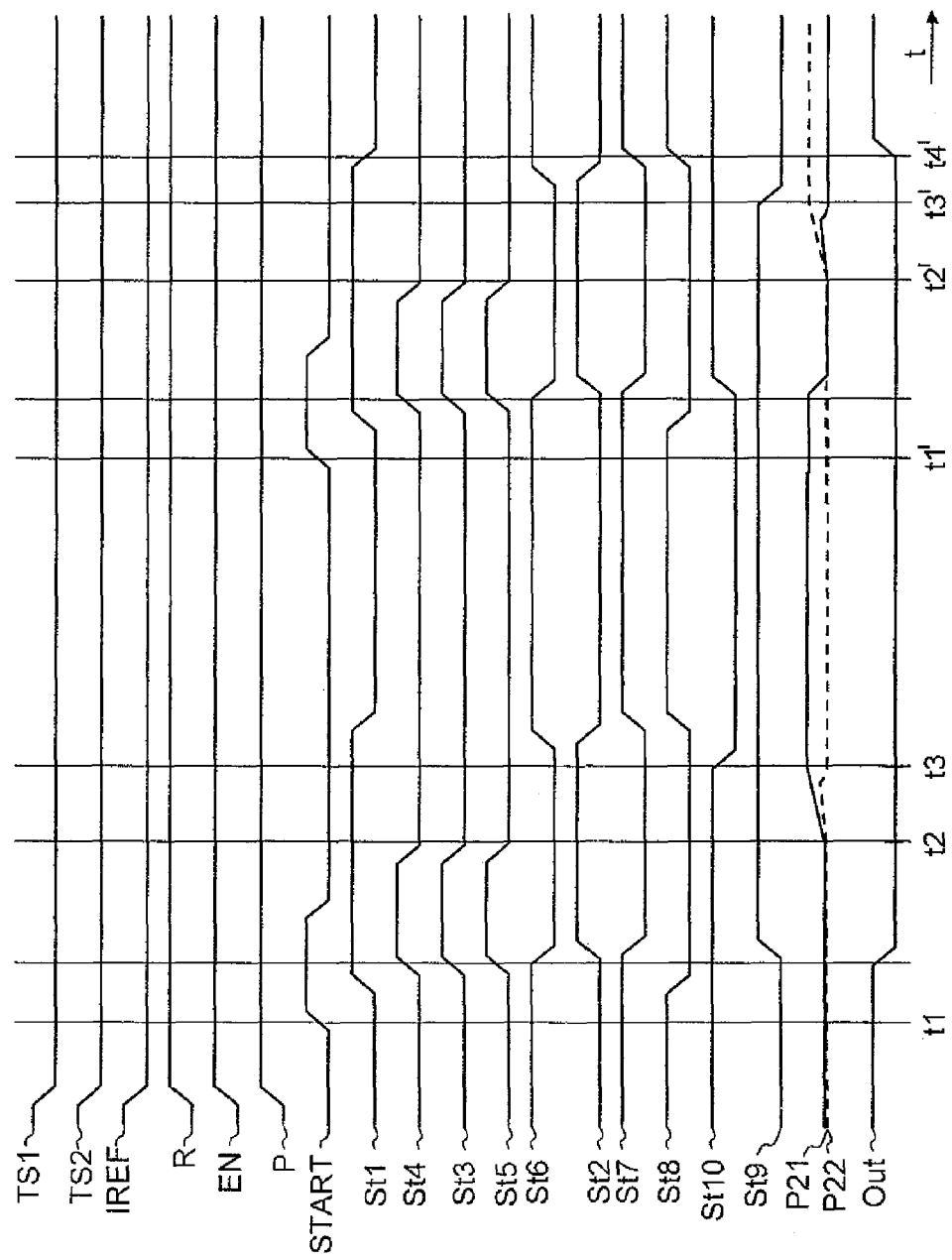
FIG. 2 shows exemplary timing diagrams to explain the functioning of the embodiment according to FIG. 1.

FIG. 2 shows exemplary timing diagrams to explain the functioning of the embodiment according to FIG. 1. The temporal sequence of control signals of two successive readout processes in the reading mode is presented. The readout circuit from FIG. 1 is the basis here. The state logic 0 corresponds to reference potential and the state logic 1 corresponds to the positive supply voltage. Each line shows the progression of the signal labeled by its respective reference characters. A first potential P21 marked with a dashed line, shows the progression of a potential on first line L1. A second potential P22, drawn with a solid line, shows the progression of a potential on second line L2.

In order to place control logic unit SL in a valid initial state after it is turned on, the reset signal R is briefly switched to logic 0, A first and a second test signal TS1, TS2, as well as reference current IREF, are switched to logic 0 in the reading mode. In addition, reset signal R, enable signal EN, and programming signal P are switched to logic 1.

First, the first and second lines L1, L2 are discharged during a discharging phase to reference potential terminal 30. The respective potentials on first and second lines L1, L2 are determined by the preceding readout process. If, for example, an erased first memory cell 140 was read out, then first line L1 is at reference potential. In a memory block in which two memory cells, i.e., first and second memory cells 140 and 130, are used for one data bit, there is a programmed second memory cell 130 on second line L2, and the potential of second line L2 after readout lies at the value of the positive supply voltage. If an inverse memory unit is to be read out in a next readout process at another address of a higher-level memory, then the polarities of the potential of first line L1 and the potential of second line L2 must be reversed. Therefore the first and second lines L1, L2 are connected in the discharging phase for each readout process to reference potential terminal 30. At the start of a readout process, first control signal St1 is switched to the positive supply voltage, i.e., to logic 1, and thus first and second switches S1, S2 are closed during the entire readout process. Second control signal St1 is switched to logic 0, and first and second reading switches LS1 and LS2 are opened. Sixth control signal St6 is switched to logic 1 and thus the sixth and seventh switches S6, S7 are closed. The last readout state is stored in first and second inverters 190 and 180. Eighth control signal St8 is switched to logic 1, so that the output signal Out represents the result of the previous readout process.

A new readout process that starts with the discharge phase is initiated at a first time t1 by a rising edge of start signal START. Eighth control signal St8 is switched to logic 0, The output signal Out is thereby likewise switched by first NAND-gate 170 and third inverter 150 to logic 0, Voltage peaks at output 23 of the readout circuit are thus avoided during a readout process. The third, fourth and fifth control signals St3, St4 and St5 are switched by control logic unit SL to logic 1, and therefore the third, fourth and fifth switches S3, S4, S5 are closed. Thus, first line L1 and second line L2 are each short-circuited to reference potential terminal 30. The third, fourth and fifth control signals St3, St4 and St5 correspond to the start signal START. They are delayed by control logic unit SL so that output 23 of the readout circuit can first be turned off by the eighth control signal St8. The time duration of start signal START, as well as third, fourth and fifth control signals St3, St4 and St5, is generated by a higher-level controller for all readout circuits of a memory and is adjusted to each memory size. Sixth control signal St6 is subsequently switched to logic 0, which causes an opening of sixth and seventh switches S6, S7.

Thus, first and second inverters 190 and 180 are brought into a comparison configuration. Second control signal St2 is then switched to logic 1, and first and second reading switches LS1 and LS2 are closed. Thus, both the input of first inverter 190 and the input of second inverter 180 are drawn to reference potential. The first comparison signal St9 provided at the output of first inverter 190 and the second comparison signal St10 provided at the output of second inverter 180 are drawn to logic 1, At the end of the discharge phase, third, fourth and fifth control signals St3, St4 and St5 are switched to logic 0, and therefore third, fourth and fifth switches S3, S4, S5 are opened.

At a second time t2, a readout phase begins. In the illustrated example, an erased memory cell 140 is read out. Thus, first line L1 remains at reference potential. If a reference memory cell that supplies a current at the level of half the current between a programmed and unprogrammed memory cell is used as second memory cell 130, then second line L2 is drawn to the positive supply voltage. If second memory cell 130 is implemented as a second bit cell, then second line L2 is drawn to the positive supply voltage by the current supplied by the programmed bit cell, as well. when the potential of second line L2 reaches the breakover point of second inverter 180, then the output of second inverter 180, i.e., tenth control signal St10, is switched to logic 0. The change of state of tenth control signal St10 is evaluated by control logic unit SL. Consequently, sixth control signal St6 is switched to logic 1 and sixth and seventh switches S6, S7 are closed. This is the end of the readout phrase.

At a third time t3, a storage phase begins. In this phase, first and second inverters 190 and 180 are in a storage or latch configuration. The output signal Out now shows the result of the readout process: it is at logic 0 since first memory cell 140 is erased. This result is stored. Subsequently, second control signal St2 and first control signal St1 are switched to logic 0, whereby first and second reading switches LS1 and LS2, as well as first switch S1 and second switch S2, are opened. At the end of the readout process, eighth control signal St8 is switched to logic 1.

In this self-terminated readout process, readout amplifier AV ends the readout phase automatically as soon as it has reached its decision. The power consumption is advantageously considerably reduced.

In the right half of FIG. 2, a second readout process is illustrated. In this example, the function of the charge accelerator will be described. A programmed first memory cell 140 is read out. The discharge phase begins at a time t1'. The progression of the discharge phase between the time t1' and a time t2' corresponds to the above-described progression of the discharge phase between first time t1 and second time t2. In addition, in the discharge phase, seventh control signal St7 is switched to logic 0 after second control signal St2 is switched to logic 1, Eighth and ninth switches S8, S9 of charge accelerator LB are thereby closed. First capacitor C0 and second capacitor C1 are discharged.

At a time t2', control logic unit SL has opened the third, fourth and fifth switches S3, S4, S5 and the readout phase begins. First potential P21 of first line L1 and second potential P22 of second line L2 increase linearly from the reference potential. Since a programmed first memory cell 140 is situated on first line L1, there is an additional current flow on first line L1. There is no additional current flow on second line L2, because second memory cell 130 comprises either an erased bit cell or a reference cell. Due to the additional current flow, first potential P21 on first line L1 rises more rapidly than second potential P22 on second line L2. Since the control input of second controlled current source CS1 is connected to first line L1, second controlled current source CS1 is regulated down in case of increasing potential on first line L1 and therefore supplies less current for charging second capacitor C1. The potential rise on second line L2 is slowed downd. The control input of first controlled current source CS0 is connected to second line L2 and thus supplies a current for charging first capacitor C0. The potential rise on first line L1 is thereby accelerated and the increase of the potential on second line L2 is slowed down. Due to the faster increase of the potential on first line L1, second transistor T2 is controlled into the conductive state via its gate terminal. Consequently, second transistor T2 draws second line L2 to the reference potential terminal 30. First controlled current source CS0 is thereby driven even higher and first potential P21 on first line L1 rises even faster. When the switching threshold of first inverter 190 is reached, then the end of the readout phase is reached when first comparison signal St9 at the output of first inverter 190 switches at a time t3'. Control logic unit SL closes the readout process.

The progression of the storage phase corresponds to that of the storage phase as described above. At a time t4', output signal OUT switches to logic 1, which corresponds to the result of the readout of a programmed first memory cell 140. Seventh control signal St7 is switched to logic 1, and eighth and ninth switches S8, S9 are opened.

The readout process is advantageously markedly accelerated by first integrator CS0, C0 and second integrator CS1, C1 of charge accelerator LB. The readout speed is thereby increased by a factor of 10.

It is advantageously possible with the readout circuit according to an embodiment of the invention to read out the state of first and second memory cells 140, 130 even at a very low supply voltage of roughly 1 V. Since only a very small readout current of roughly 2 µA is flowing, the power consumption is minimal. The readout time lies in the nanosecond range, roughly 200 ns.

Figure 3:
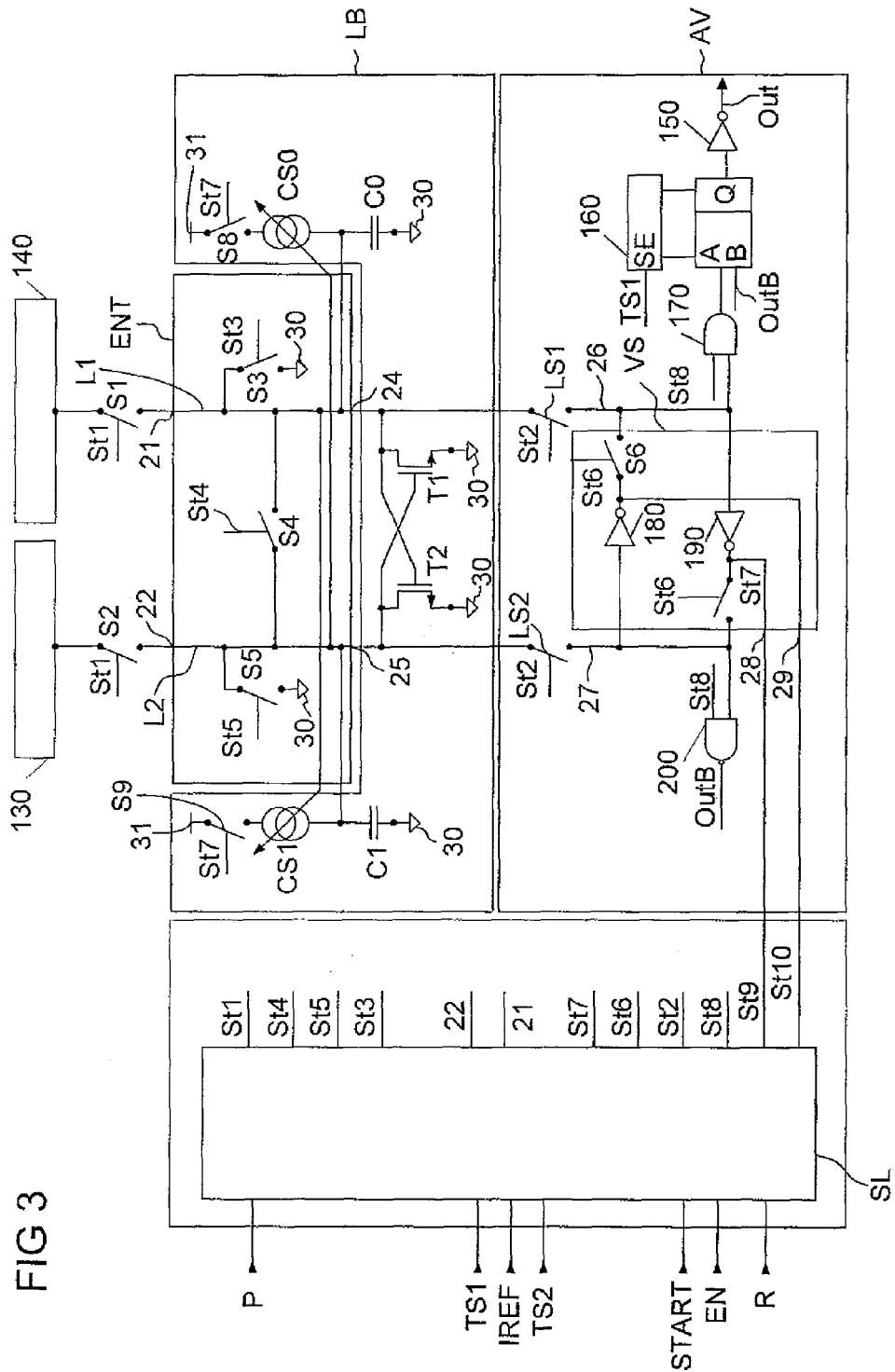
FIG. 3 shows a second exemplary embodiment of a readout circuit according to the invention.

FIG. 3 shows a second exemplary embodiment of a readout circuit according to the invention. The readout circuit of FIG. 3 corresponds to the readout circuit of FIG. 1. It additionally comprises a multiplexer 160 that is inserted between first NAND-gate 170 and third inverter 150 of readout amplifier AV. The output of first NAND-gate 170 is connected to an input A of multiplexer 160. An input B of multiplexer 160 is connected to the output of second NAND-gate 200. The first test control signal TS1 is applied to a control input SE of multiplexer 160. An output Q of multiplexer 160 is coupled to the input of third inverter 150.

Multiplexer 160 is used in the test mode. An externally supplied reference current IREF is applied either to first line L1 or second line L2. If the readout circuit is based on a memory in which one data bit is represented by two bit cells, i.e., first memory cell 140 and second memory cell 130, then reference current IREF is applied, for example, to second terminal 22 of the readout circuit. In the readout phase of the test mode in this case, first test control signal TS1 and third control signal St3 are switched to logic 1, whereby third switch S3 is closed. Thus, second memory cell 130 is tested. For this purpose, the output of second NAND-gate 200 is connected with the aid of multiplexer 160 to the input of third inverter 150.

For testing first memory cell 140, reference current IREF is applied to first terminal 21 of the readout circuit. In the readout phase, second test control signal TS2 and fifth control signal St5 are then switched to logic 1, whereby fifth switch S5 is closed and second line L2 is therefore inactive.

In order to evaluate the programming or erasing margin of first or second memory cell 140, 130, the applied reference current IREF is subtracted from the current generated by the memory cell. In case of an erased first or second memory cell 140, 130, the value of reference current IREF lies at roughly 1 µA, in order to find weakly erased memory cells in the memory. If, for example, an erased first or second memory cell 140, 130 supplies a current greater than 1 µA, then the output signal Out is drawn to logic 1, thus the weakly erased memory cell is identified. In case of a programmed first or second memory cell 140, 130, the value of reference current IREF lies at roughly 30 µA, depending on the technology. If a weakly programmed first or second memory cell 140, 130 supplies a current below 30 µA, then output signal Out remains at logic 0, The weakly programmed memory cell is recognized.

The illustrated readout circuit advantageously allows an identification of weakly programmed or weakly erased memory cells. This represents a so-called weak bit test possibility. If the reference current IREF is applied in the test mode to all readout circuits of a memory, then the programming or erasing margin of each individual memory element can be determined by simple digital readback of the entire memory contents. The very time-intensive analog current measurement of each memory cell can be eliminated. This is of particular advantage in production testing.

The time sequence of the test mode corresponds to the time sequence of the reading mode, i.e., it also passes through the discharge phase, the charge phase and the storage phase. In the readout phase, only one line is selectively turned on; the other line is set to reference potential.

Figure 4:
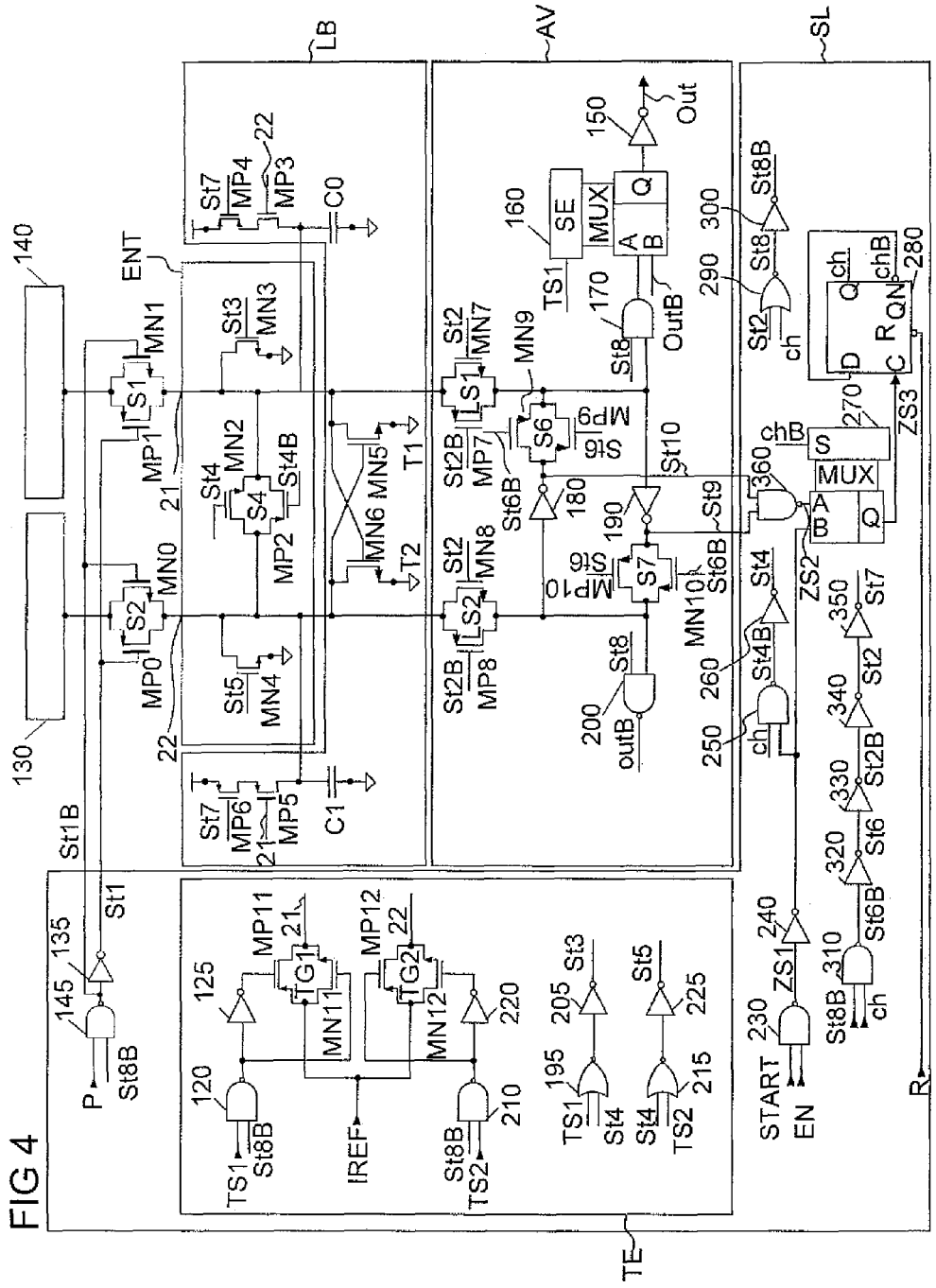
FIG. 4 shows a third exemplary embodiment of a readout circuit according to the invention.

FIG. 4 shows a third exemplary embodiment of a readout circuit according to the invention. The exemplary embodiment of FIG. 4 corresponds to the readout circuit of FIG. 3, wherein all switches S1 to S9, as well as control logic unit SL, are realized on the transistor level or with the aid of logic gates.

The first, second, fourth, sixth and seventh switches S1, S2, S4, S6, S7, as well as the first reading switches LS1, LS2, are each implemented as a so-called transmission gate. A transmission gate comprises an NMOS and a PMOS transistor, wherein a source terminal of the PMOS transistor is connected to a drain terminal of the NMOS transistor and forms one terminal of the respective switch. A source terminal of the NMOS transistor is connected to a drain terminal of the PMOS transistor and forms a second terminal of the respective switch. An NMOS transistor is labeled with the letters MN and a PMOS transistor is labeled with the letters MP. The respective control signal of the realized switch as described in FIG. 1 is supplied to the gate terminal of the PMOS transistor. The control signal inverted with respect to this control signal is supplied to the gate terminal of the NMOS transistor. A respective inverted control signal is labeled with the letter B.

First switch S1 is formed by the transmission gate having transistors MN1 and MP1. Second switch S2 is realized by the transmission gate comprising transistors MN0 and MP0. The transmission gates of the first and second switches S1, S2 are realized as high-voltage transmission gates. The high-voltage design of these transmission gates is necessary in order to isolate the readout circuit, which is implemented in low-voltage technology, during a writing process in the memory from a high-voltage circuit component that is needed to program or erase the memory cells. The other transmission gates are implemented in low-voltage technology. Fourth switch S4 is implemented as a transmission gate comprising transistors MN2 and MP2. First reading switch LS1 comprises a transmission gate having transistors MN7 and MP7. Second reading switch LS2 comprises a transmission gate that is formed from transistors MN8 and MP8. Sixth switch S6 comprises a transmission gate having transistors MP9 and MN9. Seventh switch S7 comprises a transmission gate having transistors MN10 and MP10.

Third switch S3 is realized as an NMOS transistor MN3 and fifth switch S5 is realized as am NMOS transistor MN4. Seventh switch S7 of charge accelerator LB is realized as a PMOS transistor MP4, and ninth switch S9 of charge accelerator LB is realized as a PMOS transistor MP6. First controlled current source CS0 is realized by a high-voltage PMOS transistor MP3. Second controlled current source CS1 is realized as a high-voltage PMOS transistor MPS. Since the currents of controlled current sources CS0 and CS1 must match the currents of first or second memory cell 140, 130, the controlled current sources are implemented by the same type of high-voltage transistors as the memory cells.

FIG. 4 additionally shows an example of an implementation of control logic unit SL. The generation of the individual control signals is illustrated. The signals required in the test mode, i.e., first and second test control signals TS1, TS2, as well as the supply of reference current IREF, are represented in a test unit TE. An inverted first control signal St1B is obtained by combining the programming signal P with an inverted eighth control signal StBB in NAND-gate 145. An inverter 135 generates first control signal St1 from the inverted first control signal SUB. A combination of start signal START with activation signal EN in NAND-gate 230 generates a first intermediate signal ZS1. An inverter 240 inverts first intermediate signal ZS1 and provides the inverted first intermediate signal ZS1B. The inverted fourth control signal St4B is generated by a combination of the inverted first intermediate signal ZS1B with a charge signal ch in NAND-gate 250. Fourth control signal St4 is produced from this in inverter 260. A second intermediate signal ZS2 is produced by combination of first comparison signal St9 with second comparison signal St10 in a NAND-gate 360. This is supplied to a first input of a multiplexer 270. The inverted first intermediate signal ZS1B is supplied to a second input of multiplexer 270. Under the control of the inverted charge signal chB, multiplexer 270 provides at its output the third intermediate signal ZS3, which is supplied to a clock input of a D-flipflop 280. The reset signal R is supplied to a reset input of D-flipflop 280. At its first output, D-flipflop 280 provides the charge signal ch, and provides the inverted charge signal chB at its inverting output. The second output of D-flipflop 280 is connected back to its first input. A combination of the inverted eighth control signal St8B and charge signal ch in NAND-gate 310 yields an inverted sixth control signal St6B. The latter is transformed into the sixth control signal St6 in inverter 320. An inversion of sixth control signal St6 in inverter 230 determines the inverted second control signal St2B. From this, an inverter 340 generates second control signal St2. A downstream inverter 350 provides seventh control signal St7 by inverting second control signal St2. From the combination of second control signal St2 and charge signal ch, eighth control signal St8 is obtained from a NOR-gate 290. From the eighth control signal, an inverter 300 generates the inverted eighth control signal St8B.

Controlled by first and second test signals TS1 and TS2, reference current IREF is selectively supplied either via a first transmission gate TG1 to first terminal 21 or via a second transmission gate TG2 to second terminal 22 of the readout circuit. First transmission gate TG1 comprises a transistor MP11 and a transistor MN11. A control signal for transistor MN11 is obtained by combining first test control signal TS1 with the inverted eighth control signal St8B in NAND-gate 120. From this signal, a control signal for transistor MP11 is obtained by inversion in inverter 125. A control signal for transistor MP12 of second transmission gate TG2 is obtained by combining second test control signal TS2 with the inverted eighth control signal St8B in NAND-gate 210. By inverting this control signal in inverter 220 a control signal for transistor MN12 of second transmission gate TG2 is obtained. Third control signal St3 is obtained by combining first test control signal TS1 with fourth control signal St4 in a NOR-gate 195 and subsequent inversion with an inverter 205. Fifth control signal St5 is obtained by combining second test control signal TS2 with fourth control signal St4 in a NOR-gate 215 and subsequent inversion in an inverter 225.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. Readout circuit for rewritable memories, comprising:
   a control logic unit with an input for supplying a start signal and with several outputs for providing a respective control signal as a function of the start signal;
   a first terminal for switchable connection to a first memory cell by means of a first switch, and a second terminal for switchable connection by means of a second switch to a second memory cell; and
   a readout unit, coupled to the control logic unit, as well as to the first and the second terminals, with an output for providing an output signal as a function of a state of the first and/or second memory cell and as a function of the control signals,
   wherein the readout circuit is designed for self-terminated operation in a reading mode and in a test mode.

2. The readout circuit according to claim 1, wherein the first and second switches are each controlled by a first control signal provided by the control logic unit.

3. The readout circuit according to claim 1, readout unit comprising:
   a discharge unit for discharging a first and a second line, wherein the first line is connected on the one hand to the first terminal of the readout circuit, and on the other to a first output of the discharge unit, and wherein the second line is connected on the one hand to the second terminal of the readout circuit, and on the other to a second output of the discharge unit; and
   a readout amplifier having a first input, as second input, and an output, wherein the first input of the readout amplifier is switchably connected via a first reading switch to the first output of the discharge unit, wherein the second input of the readout amplifier is switchably connected via a second reading switch to the second output of the discharge unit, and wherein at the output of the readout amplifier the output signal is provided.

4. The readout circuit according to claim 3, wherein first and second reading switches are each controlled by a second control signal provided by the control logic unit.

5. The readout circuit according to claim 3, wherein the discharge unit has a third switch for switchable connection of the first terminal to a reference potential terminal, a fourth switch for switchable connection of the first terminal to the second terminal and a fifth switch for switchable connection of the second terminal to a reference potential terminal.

6. The readout circuit according to claim 5, wherein the third switch is controlled by a third control signal, the fourth switch is controlled by a fourth control signal, and the fifth switch is controlled by a fifth control signal, and wherein third, fourth and fifth control signals are each provided by the control logic unit.

7. The readout circuit according to claim 3, wherein the readout amplifier comprises:
   a comparison memory unit having a first terminal, a second terminal, a first output, and a second output, wherein the comparison memory unit is switchably connected by its first terminal to the first output of the discharge unit via the first reading switch, wherein the comparison memory unit is switchably connected by its second terminal to the second output of the discharge unit via the second reading switch, wherein at the first output of the comparison memory unit a first comparison signal is provided that is supplied to the control logic unit, and wherein at the second output of the comparison memory unit a second comparison signal is provided that is supplied to the control logic unit; and
   an output unit having a first input, a second input, a third input, and an output, wherein an eighth control signal is provided by the control logic unit to the first input of the output unit, wherein the second input of the output unit is switchably connected by a sixth switch to the second output of the comparison memory unit, wherein the third input of the output unit is switchably connected by a seventh switch to the first output of the comparison memory unit, and wherein the output signal is provided at the output of the output unit.

8. The readout circuit according to claim 7, wherein sixth and seventh switches are each controlled by a sixth control signal provided by the control logic unit.

9. The readout circuit according to claim 7, wherein the comparison memory unit comprises:

a first inverter having an input that is connected to the first terminal of the comparison memory unit, and an output that is connected to the first output of the comparison memory unit; and a second inverter having an input that is connected to the second terminal of comparison memory unit, and an output that is connected to the second output of the comparison memory unit.

10. The readout circuit according to claim 7, wherein the output unit comprises:

a first NAND-gate having a first input formed by the the first input of the output unit, and a second input is formed by the second input of the output unit;

a third inverter having an input that is connected to an output of the first NAND-gate, and an output at which the output signal is provided; and a second NAND-gate having a first input formed by the first input of the output unit, a second input that is formed by the third input of the output unit, and an output at which a signal inverted with respect to the output signal is provided.

11. The readout circuit according to claim 1, having a charge accelerator that is coupled, for additional charging of readout unit, to the first terminal, the second terminal and the control logic-unit.

12. The readout circuit according to claim 11, wherein the charge accelerator comprises:

a first integrator with a control input that is coupled to the second terminal of the readout circuit; and a second integrator with a control input that is coupled to the first terminal of the readout circuit.

13. The readout circuit according to claim 12, wherein the first integrator has a first capacitor that is connected on the one hand to the reference potential terminal and on the other to the first terminal of the readout circuit, and a first controlled current source that comprises the control input of the first integrator and is switchably connected on the one hand via an eighth switch to a supply potential terminal and on the other to the first terminal of the readout circuit, and wherein the second integrator has a second capacitor that is connected on the one hand to the reference potential terminal and on the other to the second terminal of the readout circuit, and a second controlled current source that comprises the control input of second integrator and is switchably connected on the one hand via a ninth switch to the supply potential terminal and on the other to the second terminal of the readout circuit.

14. The readout circuit according to claim 13, wherein the eighth and ninth switches are each controlled by a seventh control signal provided by the control logic unit.

15. The readout circuit according to claim 11, wherein the charge accelerator comprises:

a first transistor having a control terminal that is connected to the second terminal of the readout circuit, and a controlled path that is connected on the one hand to the first terminal of the readout circuit and on the other to the reference potential terminal; and a second transistor having a control terminal that is connected to the first terminal of the readout circuit, and a controlled path that is connected on the one hand to the second terminal of the readout circuit and on the other to the reference potential terminal.

16. The readout circuit according to claim 5, wherein the readout amplifier comprises:

(i) a comparison memory unit having a first terminal, a second terminal, a first output, and a second output, wherein the comparison memory unit is switchably connected by its first terminal to the first output of the discharge unit via the first reading switch, wherein the comparison memory unit is switchably connected by its second terminal to the second output of the discharge unit via the second reading switch, wherein at the first output of the comparison memory unit a first comparison signal is provided that is supplied to the control logic unit, and wherein at the second output of the comparison memory unit a second comparison signal is provided that is supplied to the control logic unit; and (ii) an output unit having a first input, a second input, a third input, and an output, wherein an eighth control signal is provided by the control logic unit to the first input of the output unit, wherein the second input of the output unit is switchably connected by a sixth switch to the second output of the comparison memory unit, wherein the third input of the output unit is switchably connected by a seventh switch to the first output of the comparison memory unit, and wherein the output signal is provided at the output of the output unit;

wherein, in the reading mode, in a discharge phase, the first, second, third, fourth, and the fifth switches, as well as the first and second reading switches, are each controlled into the closed state, and the sixth and seventh switches are each controlled into the open state, in a readout phase, the first and second switches are each controlled into the closed state, and the third, fourth and fifth switches are each controlled into the open state, and in a storage phase, the sixth and seventh switches are each controlled into the closed state, and the first, second, third, fourth, and fifth switches, as well as the first and second reading switches, are each controlled into the open state.

17. The readout circuit according to claim 16, wherein the eighth and ninth switches are each controlled into the closed state in the discharge and in the readout phase, and in the storage phase, the eighth and ninth switches are each controlled into the open state.

18. The readout circuit according to claim 1, wherein the output signal is provided in the reading mode as a function of the result of a comparison of a current through the first memory cell to a current through the second memory cell.

19. The readout circuit according to claim 10, wherein the output unit in the test mode comprises a multiplexer for testing the first and/or second memory cells, the multiplexer having a control input for the supply of a first test control signal provided by the control logic unit, a first input connected to the output of the first NAND-gate of the output unit, a second input connected to the output of the second NAND-gate of the output unit, and an output connected to the input of the third inverter of the output unit.

20. The readout circuit according to claim 19, wherein, in the test mode, in the discharge phase, the first, second, third, fourth, and fifth switches, as well as the first and second reading switches, are each controlled into the closed state, and the sixth and seventh switches are each controlled into the open state, in the readout phase, the first or second switch is controlled into the closed state, and the fourth switch, as well as the third or fifth switch are each controlled into the open state, and in the storage phase, the sixth and seventh switches are each controlled into the closed state, and the first, second, third, fourth, and fifth switches, as well as the first and second reading switches, are each controlled into the open state.

21. The readout circuit according to claim 19, wherein, in the test mode, the output signal is provided as a function of a result of a comparison of a current through the first memory cell or a current through the second memory cell to a reference current.

22. The readout circuit according to claim 21, wherein, either for testing the first memory cell, the reference current is supplied to the first terminal of the readout circuit, the fifth switch is controlled into the closed state and the first input of the multiplexer is connected to its output, or for testing the second memory cell, the reference current is supplied to the second terminal of the readout circuit, the third switch is controlled into the closed state and the second input of the multiplexer is connected to its output.

23. A readout method for rewritable memories comprising the steps of:
   discharging a first line coupled to a first terminal and switchably connectable to a first memory cell, and discharging a second line coupled to a second terminal and switchably connectable to a second memory cell, as well as discharging an output;
   reading out a respective state of the first and/or the second memory cell;
   storing the respective state of the first and/or the second memory cell; and
   providing the respective state of the first and/or the second memory cell at the output,
   wherein the readout method is designed for self-terminated operation in a reading mode and in a test mode.

24. The readout method according to claim 23, wherein an accelerated charging of the first and second lines after the discharging is provided.

25. The readout method according to claim 23, wherein, in the reading mode, the respective state of the first and/or the second memory cell is read out and stored and is provided at the output corresponding to a result of a comparison of a current the through first memory cell to a current through the second memory cell.

26. The readout method according to claim 23, wherein, in the test mode, the respective state of the first or the second memory cell is selectively adjustable read out and stored and is provided at the output corresponding to a result of a comparison of a current through the first memory cell or a current through the second memory cell, respectively, to a reference current.

* * * * *